United States Patent
Yang et al.

(10) Patent No.: US 9,022,800 B2
(45) Date of Patent: May 5, 2015

(54) ELECTRICAL CONNECTOR WITH HEAT-DISSIPATION FEAUTER THEREOF

(71) Applicant: Hon Hai Precision Industry Co., Ltd., New Taipei (TW)

(72) Inventors: An-Jen Yang, Irvine, CA (US); Terrance F. Little, Fullerton, CA (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 169 days.

(21) Appl. No.: 13/900,534

(22) Filed: May 23, 2013

(65) Prior Publication Data

US 2014/0349514 A1    Nov. 27, 2014

(51) Int. Cl.
*H01R 13/00* (2006.01)
*H01R 13/6581* (2011.01)
*H01R 12/72* (2011.01)

(52) U.S. Cl.
CPC .......... *H01R 13/6581* (2013.01); *H01R 12/724* (2013.01); *H01R 12/721* (2013.01)

(58) Field of Classification Search
USPC ............ 439/487, 485, 607.05, 607.09, 607.1, 439/607.12, 607.13, 607.15, 607.53
See application file for complete search history.

(56) References Cited

U.S. PATENT DOCUMENTS

| | | | | |
|---|---|---|---|---|
| 4,687,267 A | * | 8/1987 | Header et al. | 439/62 |
| 5,195,899 A | * | 3/1993 | Yatsu et al. | 439/101 |
| 5,618,202 A | * | 4/1997 | Okuyama et al. | 439/497 |
| 6,074,225 A | * | 6/2000 | Wu et al. | 439/101 |
| 7,758,379 B2 | * | 7/2010 | Chen | 439/607.11 |
| 8,475,216 B2 | * | 7/2013 | Tung et al. | 439/660 |
| 8,851,927 B2 | * | 10/2014 | Hsu et al. | 439/607.11 |
| 2013/0316568 A1 | * | 11/2013 | Yu et al. | 439/485 |
| 2014/0154921 A1 | * | 6/2014 | Qi et al. | 439/620.03 |
| 2014/0329405 A1 | * | 11/2014 | Hsieh | 439/485 |

FOREIGN PATENT DOCUMENTS

CN    202651473 U    1/2013

* cited by examiner

*Primary Examiner* — Neil Abrams
*Assistant Examiner* — Travis Chambers
(74) *Attorney, Agent, or Firm* — Wei Te Chung; Ming Chieh Chang

(57) ABSTRACT

An electrical connector includes an insulator base having a rear retaining portion and a front tongue portion, a first terminal module with a plurality of first terminals thereof, a second terminal module with a plurality of second terminals thereof and interlocked with the first terminal module, and a shielding shell retained to the insulator base. A heat dissipation metal plate is embedded in the insulator base, and the heat dissipation metal plate provides a contact ear extending out of the insulator base and contacting with the shielding shell for heat dissipating.

20 Claims, 10 Drawing Sheets

ELECTRICAL CONNECTOR WITH HEAT-DISSIPATION FEAUTER THEREOF

FIELD OF THE INVENTION

The present invention relates generally to an electrical connector, and more particularly to a high-speed I/O connector having a heat dissipation metal plate for dissipating away the heat produced within the connector system during normal operation.

DESCRIPTION OF THE RELATED ART

Chinese Patent Issued Number 2026514730 issued to Alltop Technology Co., Ltd. on Jan. 2, 2013 discloses an electrical connector having a heat dissipation member. The electrical connector further includes an insulative housing, a plurality of contacts retained in the housing, and a metal shell covering the housing. The heat dissipation member is defined as a pair of metal plates respectively retained on two opposite sidewalls of the metal shell, which may improve the heat dissipation function of the connector. However, the heat dissipation member is disposed outside of the metal shell, which may enhance the dimension of the electrical connector.

Hence, a new design which can provide excellent heat dissipation function and has a compact size is required.

SUMMARY OF THE INVENTION

Accordingly, an object of the present invention is to provide an electrical connector which has a heat dissipation metal plate embedded in the housing for heat dissipating.

In order to achieve the object set forth, an electrical connector includes an insulator base having a rear retaining portion and a front tongue portion, a first terminal module with a plurality of first terminals thereof, a second terminal module with a plurality of second terminals thereof, and a shielding shell retained to the insulator base and surrounding the insulator base, thereby defining a mating cavity, into which the front tongue portion extending forwards from the rear retaining portion. The first and second terminal modules interlock with each other and then is commonly inserted into a retaining room of the rear retaining portion to expose contacting portions of the first and second terminals upon opposite surfaces of the front tongue portion. A heat dissipation metal plate is embedded in the insulator base, and the heat dissipation metal plate provides a contact ear extending out of the insulator base and contacting with the shielding shell for heat dissipating.

Other objects, advantages and novel features of the invention will become more apparent from the following detailed description of the present embodiment when taken in conjunction with the accompanying drawings.

DETAILED DESCRIPTION OF THE INVENTION

Figure 1:
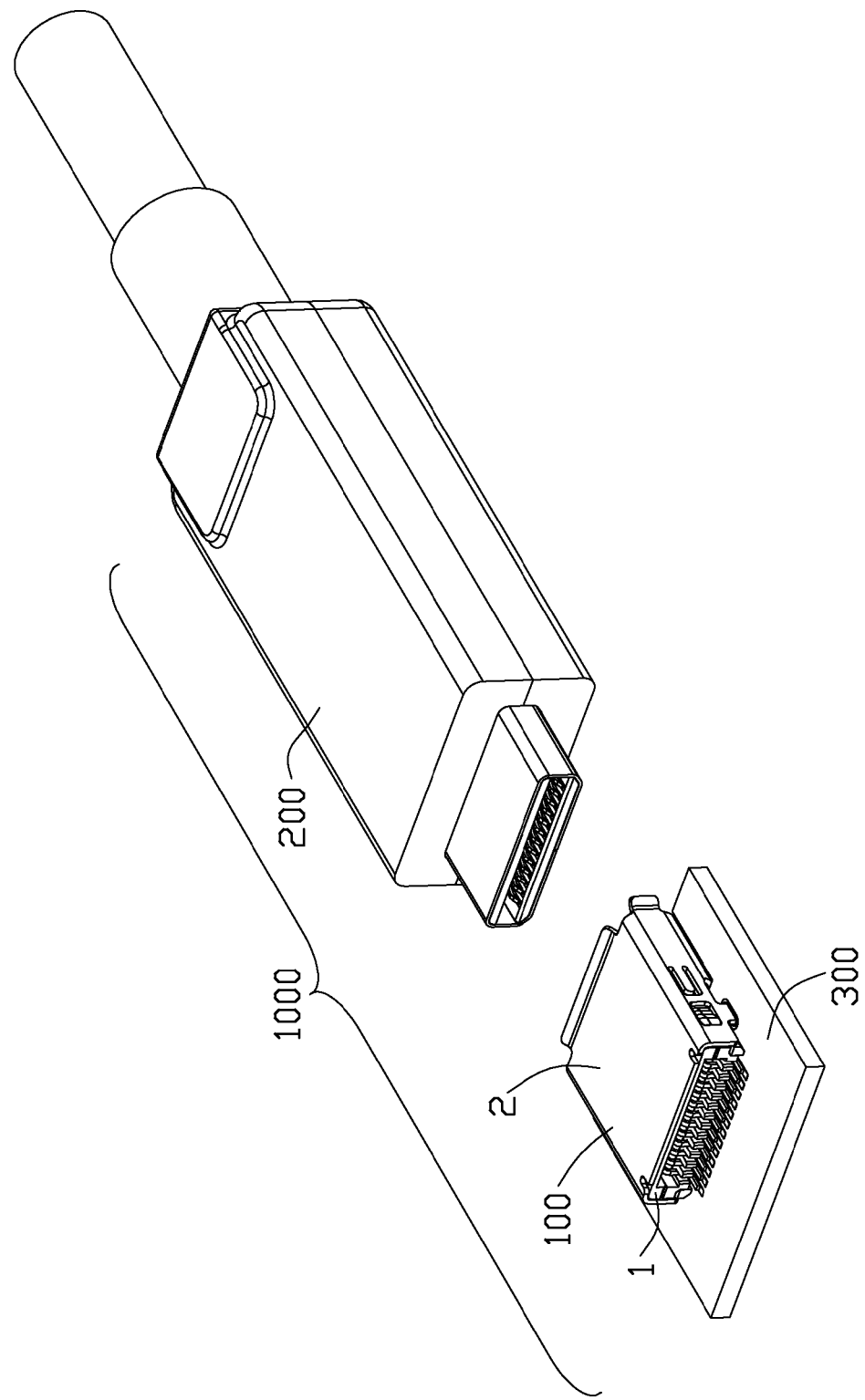
FIG. 1 is a perspective view of a connector assembly including a first/electrical connector and a second/mating connector disconnecting from each other in accordance with the present invention.

Reference will now be made to the drawing figures to describe preferred embodiments of the present invention in detail.

Figure 2:
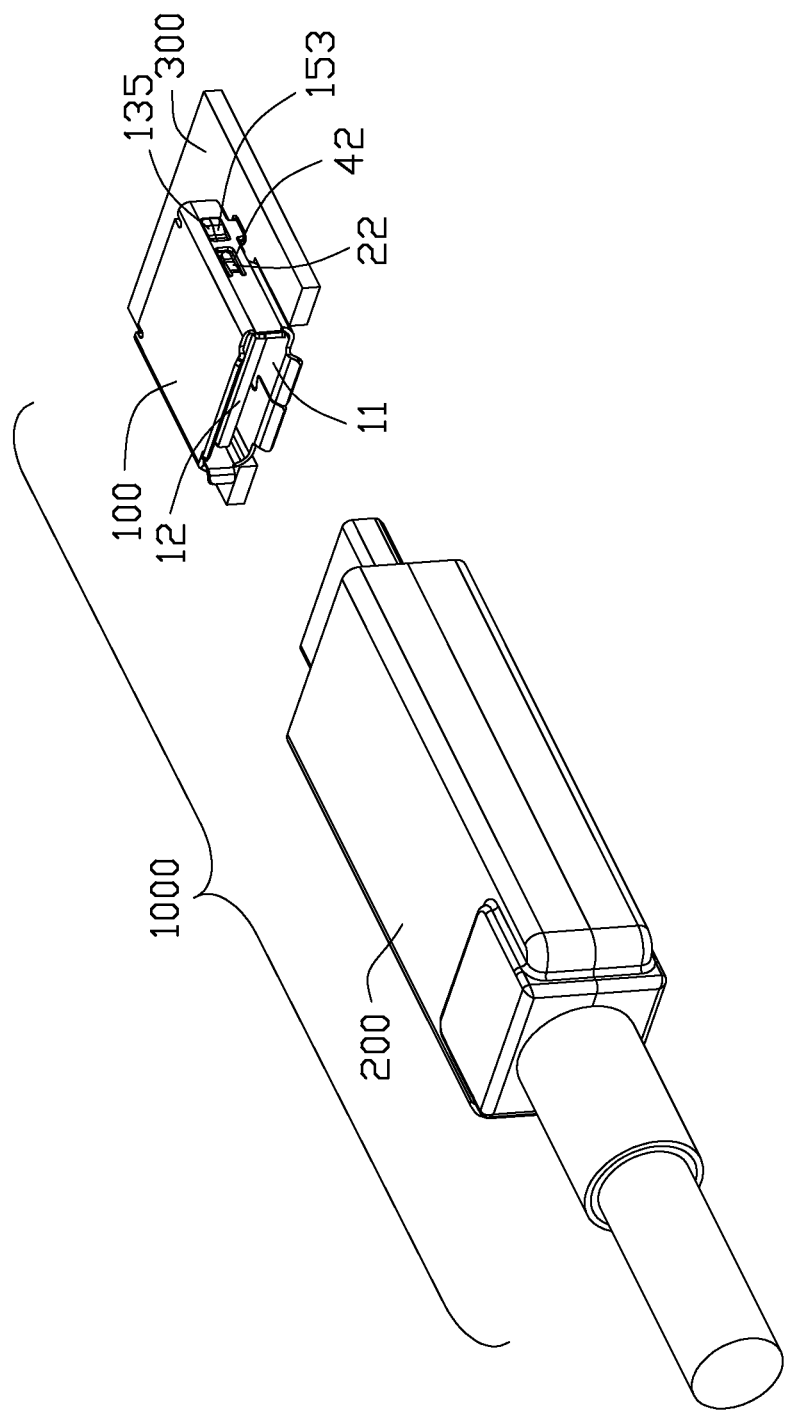
FIG. 2 is another perspective view of the connector assembly shown in FIG. 1.
Figure 3:
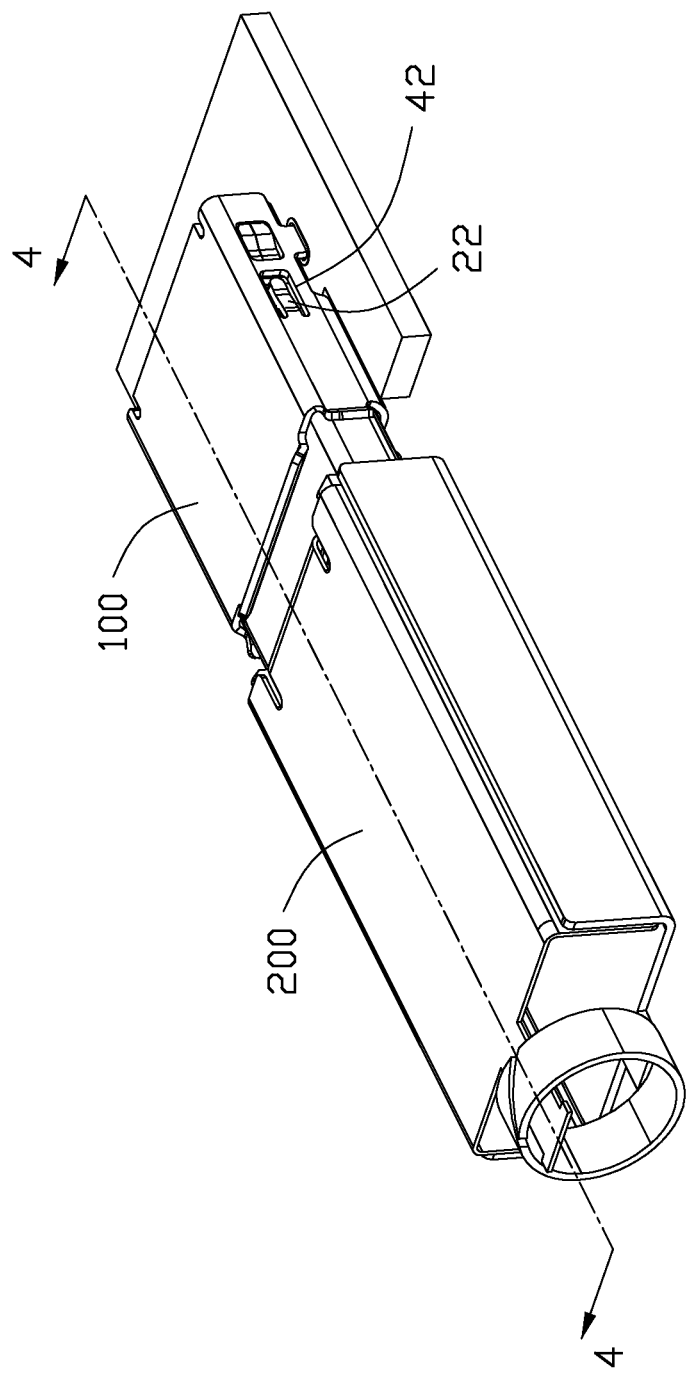
FIG. 3 is a perspective view of the connector assembly, showing the two connectors of FIG. 2 mated with each other.

Referring to FIG. 1 and FIG. 2, a connector assembly 1000 in accordance with the present invention includes a first connector/electrical connector 100 adapted for mounting to a printed circuit board 300, and a second/mating connector 200 intended to mate with the first connector 100 and connected with a cable.

Referring to FIG. 1 to FIG. 4, the electrical connector 100 includes an insulative housing 1 and a metallic shielding shell 2 retained to the housing 1 and surrounding the housing 1, thereby defining a mating cavity 11, into which a front mating tongue 12 extending forwards from a rear base 10 of the insulating housing 1. A plurality of first terminals 31 arranged in a first row and a plurality of second terminals 32 arranged in a second row are disposed at opposite surfaces of the front mating tongue 12. A heat dissipation metal plate 4 is embedded in the design of the electrical connector 100 and connects with the shell 2 to dissipate away the heat produced during normal operation. Description of the electrical connector 100 will be given hereinafter.

Figure 5:
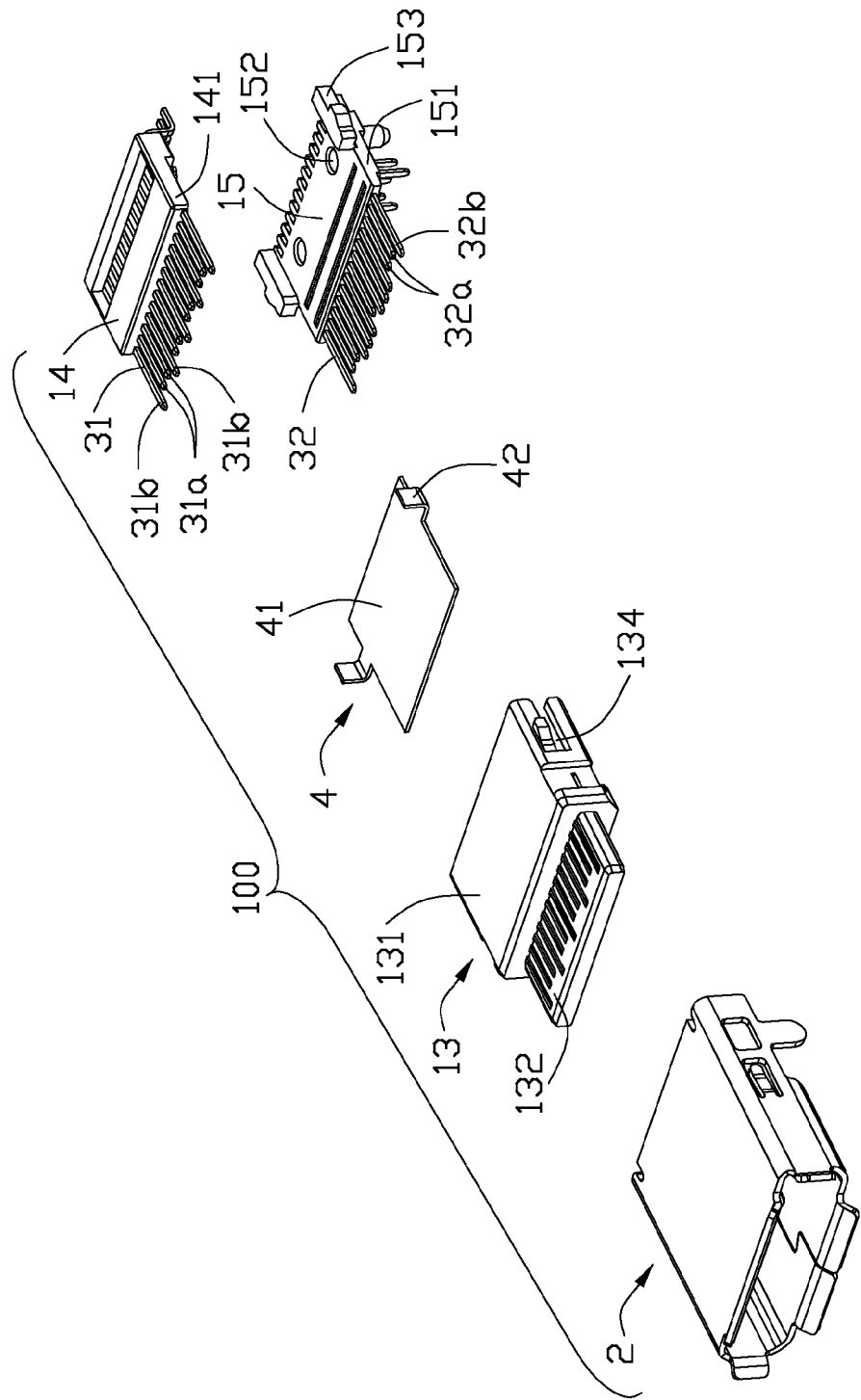
FIG. 5 is a partly exploded perspective view of the electrical connector shown in FIG. 1.
Figure 6:
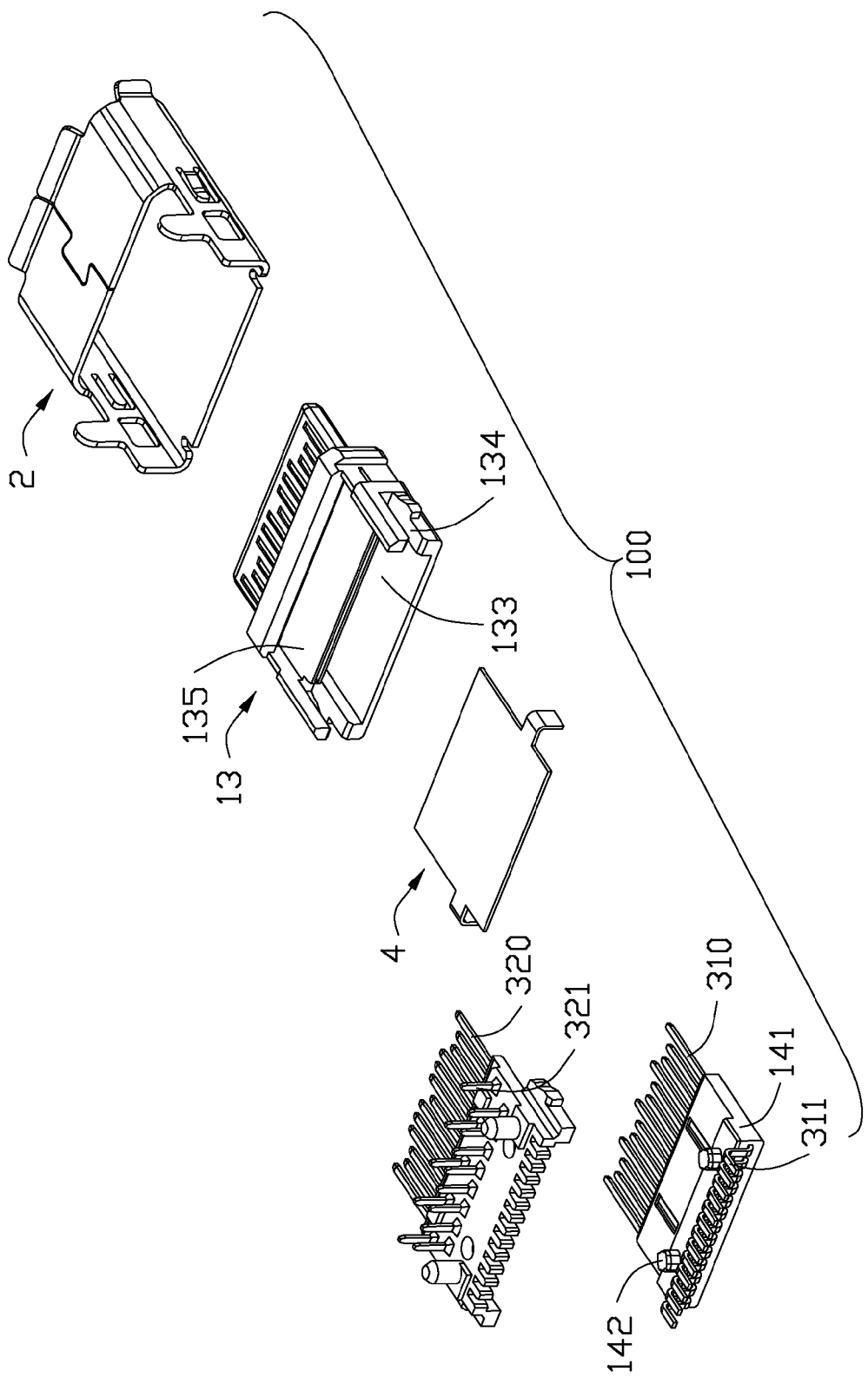
FIG. 6 is another partly exploded perspective view of the electrical connector shown in FIG. 5.
Figure 7:
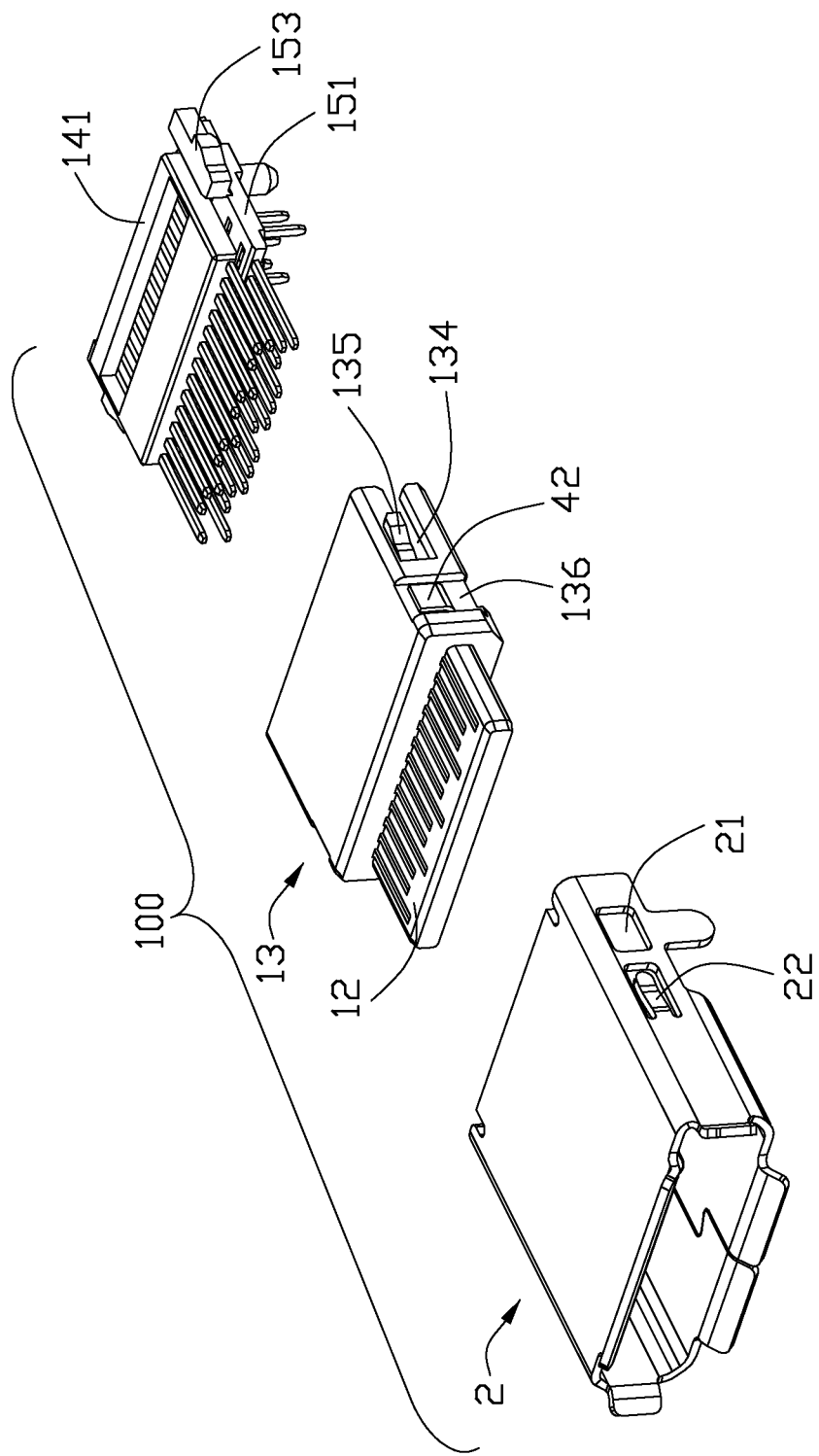
FIG. 7 is a partly exploded perspective view of the electrical connector, showing the shell and the two terminal modules separated from the insulator base.

Referring to FIG. 5 to FIG. 7, the heat dissipation metal plate 4 defines a planar main portion 41 and two contact ears 42 bending upwards respectively from two opposite side edges of the main portion 41, the main portion 41 is integrally molded with an insulator base 13. The insulator base 13 defines a retaining portion 131 and a tongue portion 132 forwardly extending from the retaining portion 131. The retaining portion 131 defines a retaining room 133 opening rearwards and downwards, and further provides a retaining slot 134 on each sidewall of the retaining portion 131. A rearwards extending partition 135 is disposed in the retaining room 133 to divide a front portion of the retaining room 133 into stacked two rooms. The tongue portion 132 defines a plurality of grooves at opposite surfaces thereof. The main portion 41 is integrally molded into the insulator base 13 with a front portion disposed in the tongue portion 132 and a rear portion disposed in the partition 135, the contact ears 42 extend out of the insulator base 13 from opposite two sides thereof and each is received in a receiving slot 136.

The first terminals 31 are molded with a first terminal module 14. The first terminal module 14 comprises a first insulator 141. The first terminals 31 comprise contacting portions 310 loaded in front of the first insulator 141 and connecting legs 311 extending out of the first insulator 141. The first row of terminals 31 comprises signal terminals 31a and grounding terminals 31b. Two adjacent signal terminals 31a consist of a differential pair of signal and two adjacent differential pair are interposed with a grounding terminal 31b, and adjacent grounding terminals 31b sandwich one differential pair. The first insulator 141 defines locking arms 142 extending downwards from a bottom face thereof.

The second terminals 32 are molded with a second terminal module 15. The second terminal module 15 comprises a second insulator 151. The second terminals 32 comprise contacting portions 320 loaded in front of the second insulator 151 and connecting legs 321 extending out of the second insulator 141. The second row of terminals 32 comprises signal terminals 32a and grounding terminals 32b. The second insulator 151 has locking recesses 152 recessed from a top face thereof, and a pair of latching arms 153 upwardly extending from two sides of the top face.

The first terminal module 14 is downwardly assembled to the second terminal module 15 to be disposed between the latching arms 153, and the locking arms 142 interlocking with locking recesses 152 to ensure that the two terminal modules 14, 15 are assembled together and interlocking with each other. The assembled first and second terminal modules 14, 15 is then commonly forwardly inserted into the insulator base 13, the first and second terminal modules 14, 15 are received in the retaining room 133 with the partition 135 sandwiched therebetween, and each latching arm 153 is retained in the retaining slot 134 to be stacked with a locking portion 135, the contacting portions 310, 320 are received in corresponding grooves at opposite surfaces of the tongue portion 132. The tongue portion 132 is served as the front mating tongue 12, the assembled retaining portion 131 and the first and second insulators 141, 151 is served as the rear base 10. Then, the shielding shell 2 is retained on the insulating rear base 10 and surrounds the front mating tongue 12 of the housing, completing an I/O connection interface. As best shown in FIG. 2, the stacked latching arm 153 and the locking portion 135 lock into a locking hole 21 of the shell 2, and a contacting finger 22 is provided for extending into the receiving slot 136 to contact with the contact ear 42.

Figure 8:
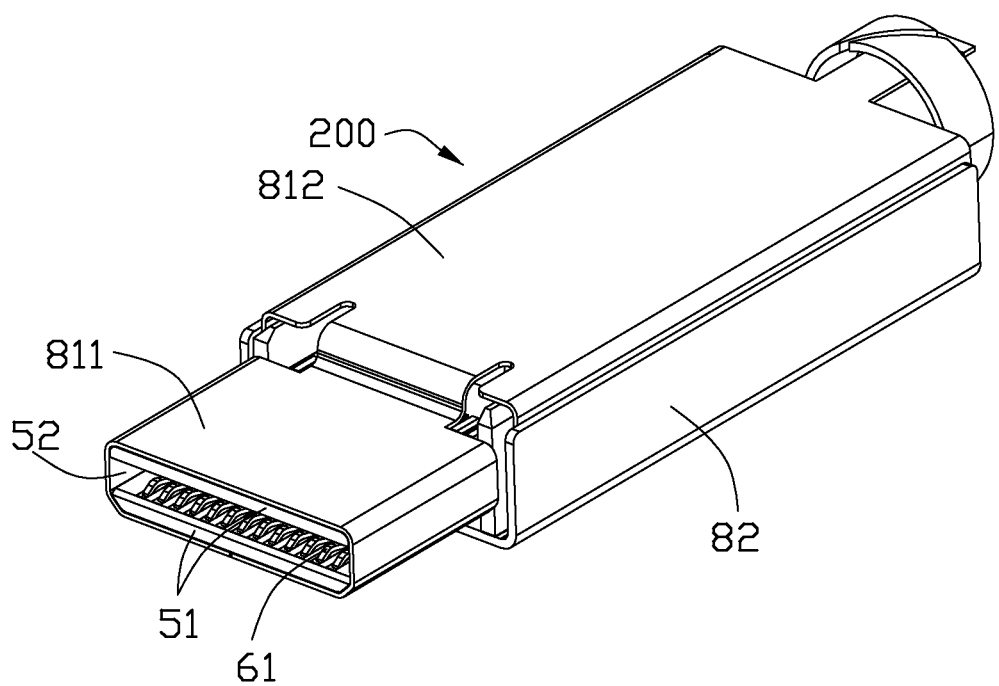
FIG. 8 is assembled perspective view of the second connector shown in FIG. 1.
Figure 9:
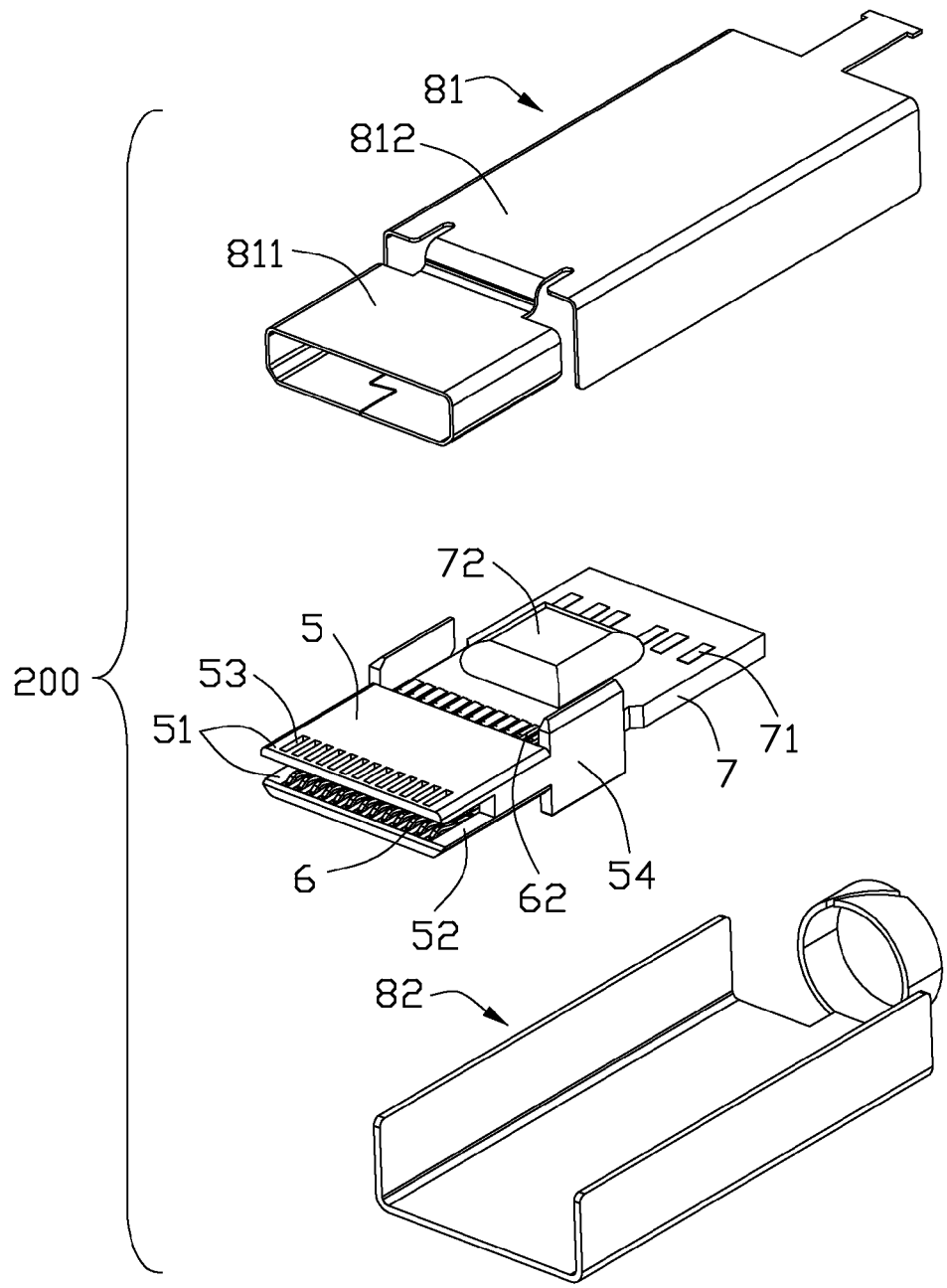
FIG. 9 is a partly exploded perspective view of the second connector shown in FIG. 8.
Figure 10:
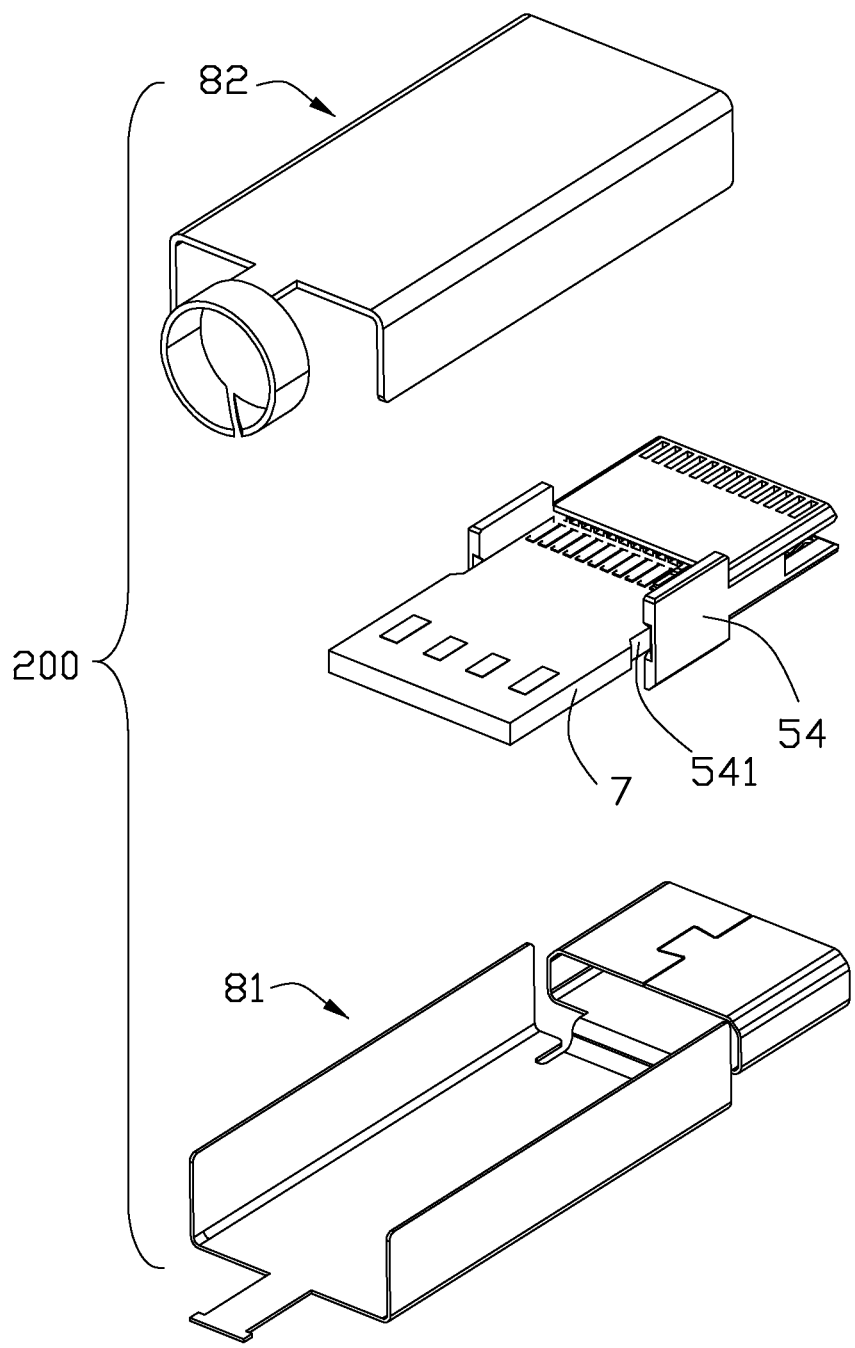
FIG. 10 is another partly exploded perspective view of the second connector shown in FIG. 9.

Referring to FIG. 8 to FIG. 10, the second connector 200 includes a second housing 5 defining two front sidewalls 51, resulting in a mating slot 52 between said two front sidewalls 51. A plurality of passageways 53 are disposed along the sidewalls 51 and run through a rear end of the second housing 5. Tow rows of mating contacts 6 are retained in the passageways 53, and the mating contacts 6 define mating portions 61 at one ends thereof and connecting portions 62 at another ends thereof. After the mating contacts 6 are received in passageways 53, the mating portions 61 are exposed to the mating slot 52. The connecting portions 62 are located behind the rear edge of the second housing 5. A pair of posts 54 is defined at two sides of the rear edge of the second housing 5.

Figure 4:
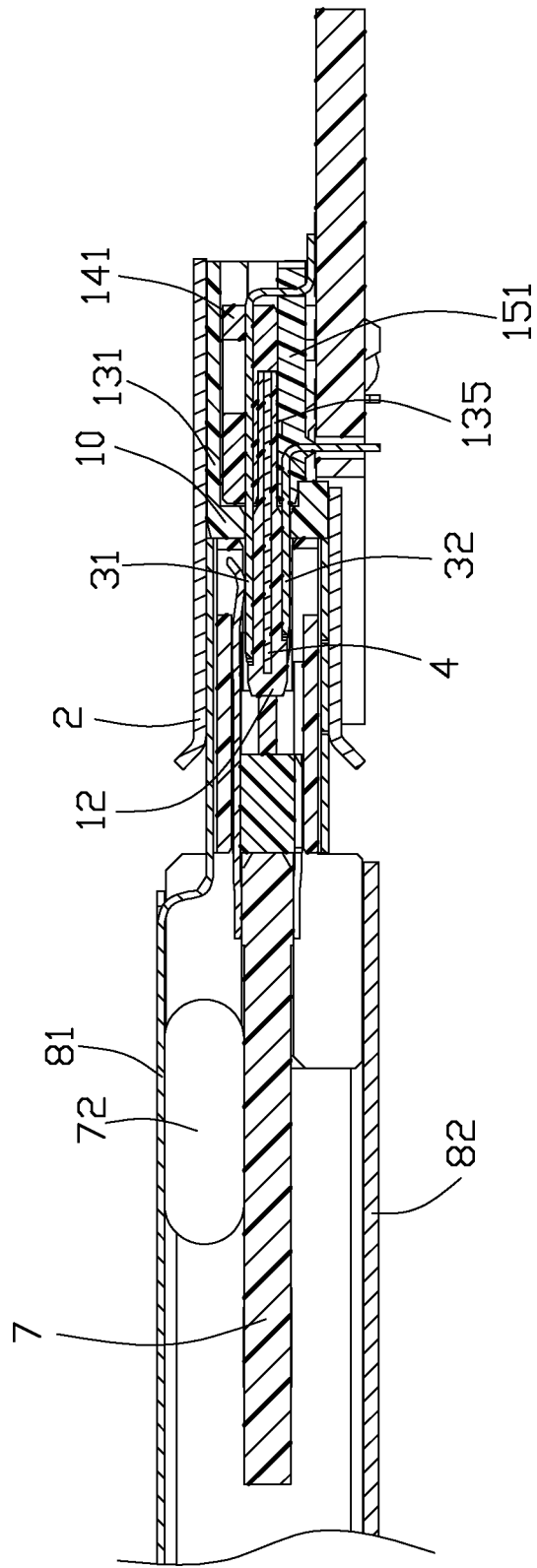
FIG. 4 is a cross-section view of the connector assembly taken along line 4-4 of FIG. 3.

An internal printed circuit board 7 is inserted along guiding recesses 541 of the posts 54 so as to connect with the connecting portions 62. The other end of the internal printed circuit board 7 has conductive pads 71 for connecting with conductive wires (not shown). A thermal pad 72 is provided onto the internal printed circuit board 7 for heat dissipation. A mating shell including a first shell 81 and a second shell 82 encloses the second housing 5 and the internal printed circuit board 7. The first shell 81 has a shielding frame 811 enclosing the two front sidewalls 51 therein and a shielding cover 812 receiving a rear portion of the second housing 51 and the internal printed circuit board 7 therein. The second shell 82 latches with the shielding cover 812 to shield the internal printed circuit board 7. The thermal pad 72 contacts with the first shell 81 of the mating shell as best shown in FIG. 4. When the first connector 100 mates with the second connector 200, the first and second terminals 31, 32 contact with the corresponding mating contacts 6 to get expectant electrical transmission, and the shielding shell 2 contacts with the mating shell for EMI shielding. Synchronously, the heat produced by active components disposed onto the internal printed circuit board 7 during normal operation transfers from the internal printed circuit board 7 through the thermal pad 72, then transfers through the first shell 81, the shielding shell 2 and then transfers into the heat dissipation metal plate 4 via the contacting fingers 22 of the shielding shell 2, which can dissipate away the heat produced within the connector system during normal operation. On other words, a first connecting line is established through the terminals 31, 32 of the first connector 100 and the mating contacts 6 of the second connector 200, and a second connecting line is established through the heat dissipation means, the shielding shell 2, the mating shell, and the thermal pad 72. Optionally, the heat dissipation metal plate 4 may be mechanically and electrically connected to the corresponding grounding contacts and to the printed circuit board 300 when the dissipation metal plate functions further as the grounding plate other than the shielding plate or the reinforcement plate.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
   an insulator base having a rear retaining portion and a front tongue portion;
   a first terminal module with a plurality of first terminals thereof;
   a second terminal module with a plurality of second terminals thereof, the first and second terminal modules interlocking with each other and then commonly inserted into a retaining room of the rear retaining portion to expose contacting portions of the first and second terminals upon opposite surfaces of the front tongue portion; and
   a shielding shell retained to the insulator base and surrounding the insulator base, thereby defining a mating cavity, into which the front tongue portion extending forwards from the rear retaining portion;
   wherein a heat dissipation metal plate is embedded in the insulator base, and the heat dissipation metal plate provides a contact ear extending out of the insulator base and contacting with the shielding shell for heat dissipating.

2. The electrical connector as described in claim 1, wherein the retaining portion defines a partition disposed in the retaining room and sandwiched between the first and second terminal module, a front portion of the heat dissipation metal plate is embedded in the front tongue portion, and a rear portion of the heat dissipation metal plate is embedded in the partition.

3. The electrical connector as described in claim 2, wherein the contact ear is stiff and bends from a side edge of the heat dissipation metal plate, the shielding shell defines resilient contacting finger for contacting with the contact ear.

4. The electrical connector as described in claim 2, wherein first terminals are integrally molded with the first terminal module.

5. The electrical connector as described in claim 2, wherein second terminals are integrally molded with the second terminal module.

6. An electrical connector assembly comprising:
a first connector and a second connector intended for mating with the first connector, the first connector for mounting to a printed circuit board, including an insulative housing, a plurality of terminals arranged on the insulating hosing, a shielding shell snugly surrounding the insulating housing and a heat dissipation means retained in the insulating housing and mechanically touching with the shielding shell; and
the second connector for connecting with a cable, including an second insulative housing, and a plurality of mating contacts arranged on the second housing, an internal printed circuit board connecting with the mating contacts and the cable and a mating shell snugly surrounding the second housing, the internal printed circuit board providing a thermal pad thereon which contacts with the mating shell;
wherein when the first connector and the second connector are mated with each other, a first connecting line is established through the terminals of the first connector and the mating contacts of the second connector, and a second connecting line is established through the thermal pad, the mating shell, the shielding shell and the heat dissipation means.

7. The electrical connector assembly as described in claim 6, wherein the heat produced inside of the second connector during normal operation can be dissipated away along the second connecting line.

8. The electrical connector assembly as described in claim 7, wherein the heat dissipation means defines a contact ear bending from a side edge thereof, and the shielding shell of the first connector defines a contacting finger, the heat transfers into the heat dissipation means via the contacting finger mechanically touching with the contact ear.

9. The electrical connector assembly as described in claim 7, wherein the insulative housing of the first connector defines a rear base and a front mating tongue, the terminals comprise contacting portions exposed upon opposite surface of the front mating tongue, a front portion of the heat dissipation means is embedded in the front mating tongue, and a rear portion of the heat dissipation means is embedded in the rear base.

10. An electrical connector assembly comprising:
a receptacle connector mounted upon a main printed circuit board and defining a first insulative housing with a shielding plate embedded therein in a parallel relation with the main printed circuit board;
a plurality of first contacts disposed in the first insulative housing with tails mounted to the main printed circuit board;
a plug connector adapted to be mated with the receptacle connector and defining a second insulative housing with a metallic shield enclosing said second insulatve housing, a plurality of second contacts disposed in the second insulative housing, a cable extending rearwardly at a rear side of the plug connector, and a secondary printed circuit board located between the second insulative housing and the cable, and mechanically and electrically connected to the contacts and corresponding wires of the cable, a plurality of active components and a thermal pad mounted upon the secondary printed circuit board, said thermal pad contacting the metallic shield; wherein
during mating of said receptacle connector and said plug connector, the metallic shield and the shielding plate are thermally connected so as to define a thermal dissipation path therebetween.

11. The electrical connector assembly as claimed in claim 10, wherein said shielding plate is embedded within a mating tongue of said first insulative housing and contacting sections of said first contacts are arranged two rows located on two opposite surfaces of said mating tongue.

12. The electrical connector assembly as claimed in claim 11, wherein said receptacle connector further includes a metallic shell enclosing the first insulative housing, and said metallic shield is thermally connected to the shielding plate via said metallic shell.

13. The electrical connector assembly as claimed in claim 12, wherein said metallic shell and said shielding plate mechanically contact each other on at least one side wall of the metallic shell.

14. The electrical connector assembly as claimed in claim 11, wherein said shielding plate is mechanically and electrically connected to a corresponding grounding contact.

15. The electrical connector assembly as claimed in claim 14, wherein said shielding plate is mechanically and electrically connected to the main printed circuit board.

16. The electrical connector assembly as claimed in claim 11, wherein said first contacts are arranged with two rows respectively associated with two terminal modules, and a rear portion of said shielding plate is located between said two terminal modules.

17. The electrical connector assembly as claimed in claim 16, wherein said two terminal modules are configured to be assembled to each other in a vertical direction.

18. The electrical connector assembly as claimed in claim 17, wherein said mating tongue further defines a rearward extending partition located between the two terminal modules to receive a rear portion of the shielding plate.

19. The electrical connector assembly as claimed in claim 18, wherein said first housing and said assembled two terminal modules are configured to allow said assembled two terminal modules to be assembled to the housing forwardly in a front-to-back direction perpendicular to said vertical direction.

20. The electrical connector assembly as claimed in claim 19, wherein at least one of said two terminal modules defines a locking lug secured to the metallic shield.

* * * * *